United States Patent
Matsumoto et al.

(10) Patent No.: US 9,459,291 B2
(45) Date of Patent: Oct. 4, 2016

(54) VOLTAGE DETECTION DEVICE

(71) Applicants: Daigo Matsumoto, Tokyo (JP); Shigeo Fujii, Tokyo (JP)

(72) Inventors: Daigo Matsumoto, Tokyo (JP); Shigeo Fujii, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 56 days.

(21) Appl. No.: 14/426,547

(22) PCT Filed: Dec. 3, 2012

(86) PCT No.: PCT/JP2012/081273
§ 371 (c)(1),
(2) Date: Mar. 6, 2015

(87) PCT Pub. No.: WO2014/087469
PCT Pub. Date: Jun. 12, 2014

(65) Prior Publication Data
US 2015/0212121 A1 Jul. 30, 2015

(51) Int. Cl.
*G01R 19/00* (2006.01)
*G01R 15/06* (2006.01)

(52) U.S. Cl.
CPC ........... *G01R 19/0007* (2013.01); *G01R 15/06* (2013.01)

(58) Field of Classification Search
CPC ........................ G01R 19/0007; G01R 15/06
USPC .................................................. 324/123 R
See application file for complete search history.

(56) References Cited

U.S. PATENT DOCUMENTS

| | | | |
|---|---|---|---|
| 5,432,438 A | 7/1995 | Baumgartner et al. | |
| 5,991,177 A * | 11/1999 | Kaczkowski | G01R 1/44 361/287 |

(Continued)

FOREIGN PATENT DOCUMENTS

| | | | |
|---|---|---|---|
| JP | 62019774 A | * | 1/1987 |
| JP | 04215075 A | * | 8/1992 |

(Continued)

OTHER PUBLICATIONS

International Search Report (PCT/ISA/210) mailed on Jan. 15, 2013, by the Japanese Patent Office as the International Searching Authority for International Application No. PCT/JP2012/081273.

(Continued)

*Primary Examiner* — Billy Lactaoen
(74) *Attorney, Agent, or Firm* — Buchanan Ingersoll & Rooney PC

(57) ABSTRACT

A voltage detection device is such that an intermediate electrode is provided between a central conductor to which a voltage is applied and a grounded tank to constitute a voltage divider and detects a voltage of the central conductor on the basis of a voltage of the voltage divider. The voltage detection device includes an integration circuit to which a voltage of the voltage divider, which is an output of the voltage divider, is input, an analog circuit that amplifies an output voltage of the integration circuit to a specified amplitude, an amplifier/attenuator to which a voltage of the voltage divider, which is an output of the voltage divider, is input and that amplifies or attenuates the voltage of the voltage divider to the specified amplitude, and an adder that adds an output voltage of the analog circuit and an output voltage of the amplifier/attenuator.

2 Claims, 5 Drawing Sheets

(56) References Cited

U.S. PATENT DOCUMENTS

| | | | | |
|---|---|---|---|---|
| 6,094,044 | A | * 7/2000 | Kustera | G01R 15/18 |
| | | | | 324/127 |
| 6,919,717 | B2 | * 7/2005 | Ghassemi | G01R 15/16 |
| | | | | 324/117 R |
| 2004/0201373 | A1 | 10/2004 | Kato | |

FOREIGN PATENT DOCUMENTS

| JP | 5-251251 A | | 9/1993 |
|---|---|---|---|
| JP | 2000298144 A | * | 10/2000 |
| JP | 2001-66329 A | | 3/2001 |
| JP | 2002-271924 A | | 9/2002 |
| JP | 2002-311061 A | | 10/2002 |
| JP | 2003284252 A | * | 10/2003 |
| JP | 2004-117310 A | | 4/2004 |
| JP | 2004-257905 A | | 9/2004 |
| JP | 2004-347397 A | | 12/2004 |
| JP | 2006-337358 A | | 12/2006 |
| JP | 2008256550 A | * | 10/2008 |

OTHER PUBLICATIONS

Written Opinion (PCT/ISA/237) mailed on Jan. 15, 2013, by the Japanese Patent Office as the International Searching Authority for International Application No. PCT/JP2012/081273.

Taniguchi et al., Advanced CT/PD, Mitsubishi Denki giho vol. 75, No. 8, 2001 (month unknown), pp. 31-36.

\* cited by examiner

VOLTAGE DETECTION DEVICE

FIELD

The present invention relates to a voltage detection device in which an intermediate electrode is provided between a central conductor, such as a gas insulated switchgear (GIS), and a tank to constitute a voltage divider and that measures the voltage of the central conductor on the basis of the voltage of the voltage divider.

BACKGROUND

In a conventional voltage detection device, an intermediate electrode is provided between a central conductor and a tank to constitute a voltage divider, and the voltage of the voltage divider is input to a signal processing circuit in order for it to detect the voltage of the central conductor on the basis of the voltage of the voltage divider (for example, see Patent Literature 1). With this configuration, while a stray capacitance is formed between the central conductor and the intermediate electrode and an earth capacitance is formed between the central conductor and the tank, by further connecting a voltage dividing resistor in parallel with the earth capacitance between the central conductor and the tank, the voltage value of the intermediate electrode can be dropped to a level capable of being input to the signal processing circuit. That is, when the voltage dividing resistor is not provided, the voltage value of the intermediate electrode determined by the ratio between the stray capacitance and the earth capacitance generally reaches several kilovolts, which is not suitable for being input to the signal processing circuit; therefore, the voltage dividing resistor is provided as described above.

CITATION LIST

Patent Literature

Patent Literature 1: Japanese Patent Application Laid-open No. 2004-347397

SUMMARY

Technical Problem

However, in the conventional voltage detection device, a high-pass filter (a time-derivative characteristic) is formed by the stray capacitance between the central conductor and the intermediate electrode, the earth capacitance between the central conductor and the tank, and the voltage dividing resistor provided between the central conductor and the tank and connected in parallel with the earth capacitance. Therefore, in a monotonous integration process (a low-pass filter characteristic) in the signal processing circuit, high-frequency components generated transitionally when an accident or the like occurs are cut; therefore, there is a problem in that it is difficult to measure the response of the voltage waveform of the central conductor accurately when an accident or the like occurs.

The present invention has been achieved in view of the above and an object of the present invention is to provide a voltage detection device that can accurately detect even high-frequency components generated transitionally when there is an accident or the like over a wide band.

Solution to Problem

In order to solve the above problems and achieve the object, a voltage detection device according to the present invention relates to a voltage detection device in which an intermediate electrode is provided between a central conductor to which a voltage is applied and a grounded tank to constitute a voltage divider, and that detects a voltage of the central conductor on a basis of a voltage of the voltage divider, including: an integration circuit to which a voltage of the voltage divider is input, the voltage divider having a high-pass filter characteristic formed by a stray capacitance between the central conductor and the intermediate electrode, an earth capacitance between the central conductor and the tank, and a voltage dividing resistor connected in parallel with the earth capacitance; a first gain adjusting unit that amplifies an output voltage of the integration circuit to a specified amplitude; a second gain adjusting unit to which a voltage of the voltage divider is input and that amplifies or attenuates the voltage of the voltage divider to the specified amplitude; and an adder that adds an output voltage of the first gain adjusting unit and an output voltage of the second gain adjusting unit.

Advantageous Effects of Invention

According to the present invention, an effect is obtained where even high-frequency components generated transitionally when an accident or the like occurs can be accurately detected over a wide band.

DESCRIPTION OF EMBODIMENTS

A voltage detection device according to embodiments of the present invention will be explained below in detail with reference to the accompanying drawings. The present invention is not limited to the embodiments.

Conventional Configuration.

Figure 5:
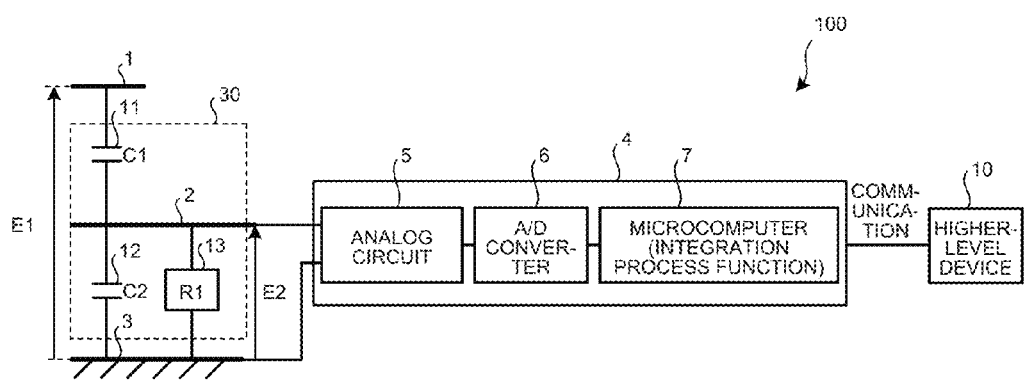
FIG. 5 is a diagram showing an example of the configuration of a conventional voltage detection device 100.

The configuration of a conventional voltage detection device is explained first. FIG. 5 is a diagram showing an example of the configuration of a conventional voltage detection device 100. In FIG. 5, a grounded tank 3, a central conductor 1, which is arranged in the tank 3 and to which a voltage is applied, and an intermediate electrode 2, which is provided between the tank 3 and the central conductor 1, are schematically shown as part of the configuration of a gas insulated switchgear (GIS). The voltage detection device 100 is, for example, a voltage detection device for a transformer.

A stray capacitance 11 is formed between the central conductor 1 and the intermediate electrode 2. In this example, the capacitance value of the stray capacitance 11 is represented by C1. An earth capacitance 12 is formed between the intermediate electrode 2 and the tank 3. In this example, the capacitance value of the earth capacitance 12 is represented by C2. An external voltage-dividing resistor 13 connected in parallel with the earth capacitance 12 is provided between the intermediate electrode 2 and the tank 3. In this example, the resistance value of the external voltage-dividing resistor 13 is represented by R1. The intermediate electrode 2 constitutes a voltage divider 30, and a voltage (a voltage to ground) E1 of the central conductor 1 is divided so as to be a voltage E2 (a voltage divider voltage) of the intermediate electrode 2, and the voltage E2 is input to a signal processing circuit 4. The voltage divider 30 having a high-pass filter characteristic is formed by the stray capacitance 11, the earth capacitance 12, and the external voltage-dividing resistor 13.

The signal processing circuit 4 is configured to include an analog circuit 5 to which the voltage divider voltage E2 is input, an A/D converter 6 that performs A/D-conversion on an analog signal output from the analog circuit 5 to a digital signal and outputs the converted digital signal, and a microcomputer 7 having an integration process function and a communication function with respect to the digital signal output from the A/D converter 6. The voltage detection device 100 is configured to include the signal processing circuit 4.

The voltage divider voltage E2 is amplified to a specified amplitude by the analog circuit 5 and is then converted from analog data to digital data by the A/D converter 6. The microcomputer 7 performs an integration process on the digital data to obtain a voltage signal proportional to the central conductor voltage (a voltage to ground) E1, and the digital data related to the voltage signal is transmitted to a higher-level device 10.

C1 and C2 are each in the order of several picofarads and have a ratio of about C1:C2=1:10. As an example, it is assumed that C1=1 [pF] and C2=10 [pF]. When the external voltage-dividing resistor 13 is not present, the voltage divider voltage E2 becomes E2=C1/(C1+C2)×E1, and, as an example, when E1=132/√3 [kVrms], E2 becomes E2=1/11× 132/√3≈7 [kVrms], which is a voltage value that cannot be handled in a general electronic circuit. Therefore, it is required to insert the external voltage-dividing resistor 13 in order to divide the voltage so as to be a voltage value that can be handled even in a general electronic circuit. In this case, the voltage divider voltage E2 becomes |E2|=ω×C1× R1/√(1+(ω×(C1+C2)×R1)$^2$)×|E1|. In ω=2πf, f denotes a frequency, and when the rated frequency is 50 hertz for example, R1 is set to be about 42 [kΩ] in order to realize E2=1 [Vrms].

When the external voltage-dividing resistor 13 is inserted, as described above, the voltage divider 30 having a high-pass filter characteristic is formed by the stray capacitance 11, the earth capacitance 12, and the external voltage-dividing resistor 13. That is, the voltage divider 30 forms an RC high-pass filter and has a frequency characteristic with a cutoff frequency f1=1/(2π×R1×(C1+C2)). The voltage signal waveform of the voltage divider 30 proportional to the central conductor voltage becomes a time derivative waveform of a central conductor voltage waveform due to the high-pass filter formed by the stray capacitance 11, the earth capacitance 12, and the external voltage-dividing resistor 13. Therefore, in the signal processing circuit 4, the microcomputer 7 performs a digital integration process on the digital data obtained by the analog/digital conversion performed by the A/D converter 6, thereby obtaining a voltage signal proportional to the central conductor voltage.

However, the amplitude frequency characteristic of digital integration shows a monotonous decrease (a low-pass filter characteristic), and digital integration largely depends on the sampling frequency; therefore, the voltage signal of the central conductor 1 cannot be reproduced with high fidelity on the high frequency side because the amplitude frequency characteristic of the voltage signal of the voltage divider 30 becomes not flat from the point of the cutoff frequency f1. Furthermore, because the voltage amplitude of the voltage divider 30 becomes larger as the frequency components become higher, the voltage signal may become saturated with the high frequency components in the analog circuit 5.

Figure 6A:
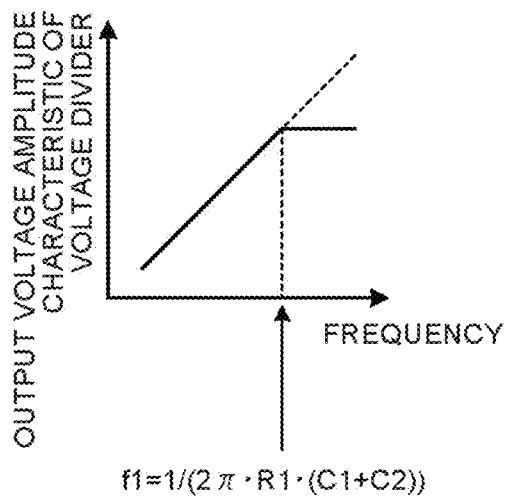
FIGS. 6 A, B and C are a diagram showing voltage amplitude characteristics at respective stages in the conventional voltage detection device shown in FIG. 5.
Figure 6B:
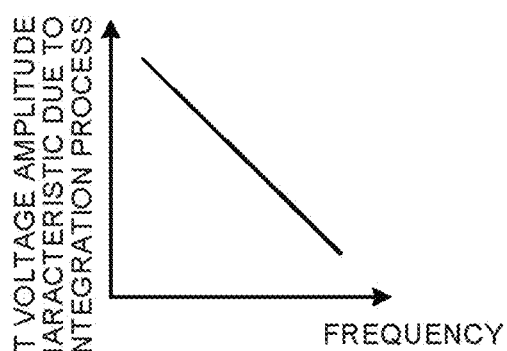
Figure 6C:
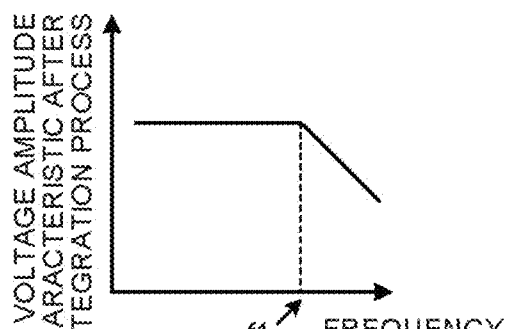

FIG. 6 is a diagram showing voltage amplitude characteristics at respective stages in the conventional voltage detection device shown in FIG. 5, where FIG. 6A is a diagram showing a frequency characteristic of the output voltage amplitude of the voltage divider 30, FIG. 6B is a diagram showing a frequency characteristic of the output voltage amplitude due to the integration process, and FIG. 6C is a diagram showing a frequency characteristic of the output voltage amplitude after the integration process. Specifically, in FIG. 6A, frequency is plotted on the horizontal axis and the input/output voltage amplitude ratio of the voltage divider 30 is plotted on the vertical axis. The horizontal axis and the vertical axis are both displayed on a logarithmic scale. In FIG. 6B, frequency is plotted on the horizontal axis and the voltage amplitude ratio before and after the integration process performed by the microcomputer 7 is plotted on the vertical axis. The horizontal axis and the vertical axis are both displayed on a logarithmic scale. In FIG. 6C, frequency is plotted on the horizontal axis and the output voltage amplitude characteristic of the signal processing circuit 4 is plotted on the vertical axis. The horizontal axis and the vertical axis are both displayed on a logarithmic scale.

As shown in FIG. 6A, the output voltage amplitude characteristic of the voltage divider 30 becomes flat (a constant value) in the frequency domain equal to or higher than the cutoff frequency f1 and shows a monotonous increase with respect to an increase of the frequency in the frequency domain equal to or lower than the cutoff frequency f1. As shown in FIG. 6B, the output voltage amplitude characteristic due to the digital integration process performed by the microcomputer 7 shows a monotonous decrease with respect to an increase of the frequency (however, it repeats minimum and maximum at a frequency higher than "(sampling frequency)/2"). FIG. 6B shows an integration process of what is called a "complete integration type". As shown in FIG. 6C, as a result of balancing the frequency characteristic of the output voltage amplitude of the voltage divider 30 and the frequency characteristic of the output voltage amplitude due to the integration process, the output voltage amplitude characteristic of the signal processing circuit 4 becomes flat (a constant value) in the frequency domain equal to or lower than the cutoff frequency f1. However, the output voltage amplitude characteristic shows a monotonous decrease with respect to an increase of the frequency in the frequency domain equal to or higher than the cutoff frequency f1. That is, in the conventional voltage detection device, it is difficult to reproduce the voltage signal waveform of the central conductor with high fidelity on the high frequency side equal to or higher than the cutoff frequency f1.

When a capacitor is incorporated after the voltage divider 30 as a measure against surge, because the cutoff frequency f1 of the voltage divider 30 shifts to the low frequency side, influences of the high-pass filter configuration of the voltage divider 30 become more noticeable.

EMBODIMENT

Figure 1:
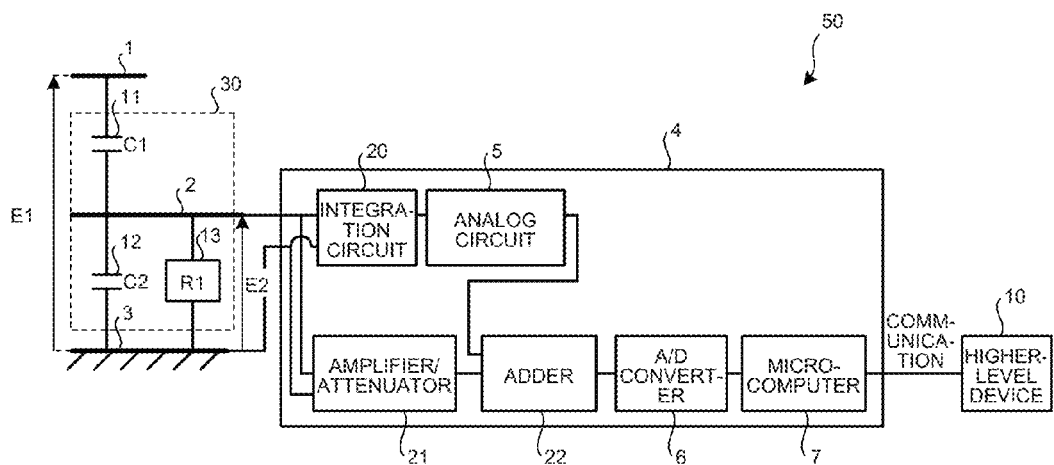
FIG. 1 is a diagram showing an example of the configuration of a voltage detection device according to an embodiment.
Figure 2:
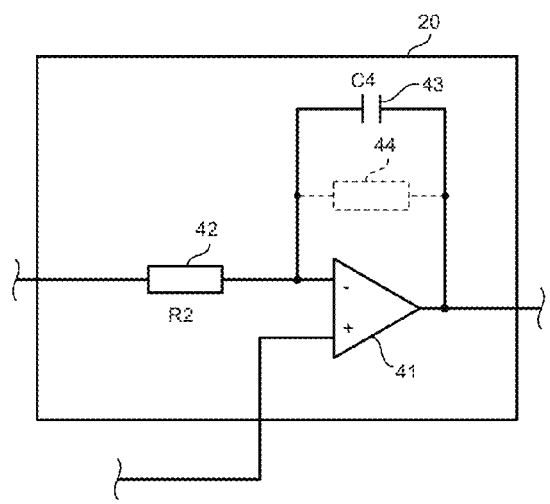
FIG. 2 is a diagram showing an example of the configuration of an integration circuit.

The present embodiment is explained next. FIG. 1 is a diagram showing an example of the configuration of a voltage detection device 50 according to the present embodiment. FIG. 2 is a diagram showing an example of the configuration of an integration circuit 20. FIG. 3 is a diagram showing voltage amplitude characteristics at respective stages in the voltage detection device according to the present embodiment.

In FIG. 1, because elements, such as the central conductor 1, the intermediate electrode 2, the tank 3, the stray capacitance 11, the earth capacitance 12, the external voltage-dividing resistor 13, the voltage divider 30, the central conductor voltage (a voltage to ground) E1, and the voltage divider voltage E2, are identical to those shown in FIG. 5, explanations thereof will be omitted.

The voltage detection device 50 is configured to include the signal processing circuit 4. The signal processing circuit 4 includes the integration circuit 20 to which the voltage divider voltage E2 is input, an amplifier/attenuator 21 to which the voltage divider voltage E2 is also input, the analog circuit 5 to which the output voltage of the integration circuit 20 is input, an adder 22 to which the output voltage of the analog circuit 5 and the output voltage of the amplifier/attenuator 21 are input and that adds both the output voltages, the A/D converter 6 to which the output voltage of the adder 22 is input, and the microcomputer 7 to which the output voltage of the A/D converter 6 is input. The microcomputer 7 also includes a communication function and can transmit a digitalized output voltage to the higher-level device 10.

In the voltage detection device 50 according to the present embodiment, when compared to the conventional voltage detection device 100 (FIG. 5), the integration circuit 20 and the amplifier/attenuator 21 are arranged at the most upstream stage of the signal processing circuit 4, and the adder 22 is provided to add a signal obtained by integrating the voltage divider voltage E2 by the integration circuit 20 and then amplifying it by the analog circuit 5 and a signal obtained by gain-adjusting the voltage divider voltage E2 by amplifying or attenuating it by the amplifier/attenuator 21.

Figure 3A:
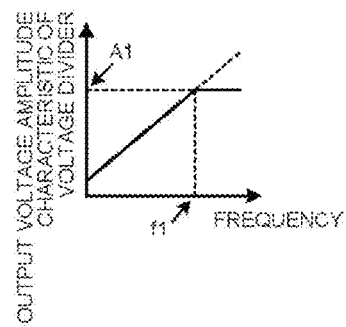
FIGS. 3A, B, C, D, E and F are a diagram showing voltage amplitude characteristics at respective stages in a voltage detection device according to the embodiment.

The integration circuit 20 is an incomplete integration circuit. The integration circuit 20 receives the voltage divider voltage E2 as an input, integrates the voltage divider voltage E2, and outputs the integrated voltage divider voltage E2 to the analog circuit 5. In this example, the amplitude characteristic of the voltage divider voltage E2 is shown in FIG. 3A. In FIG. 3A, frequency is plotted on the horizontal axis and the output voltage amplitude characteristic of the voltage divider 30 is plotted on the vertical axis. The horizontal axis and the vertical axis are both displayed on a logarithmic scale. As shown in FIG. 3A, the output voltage amplitude characteristic of the voltage divider 30 (an amplitude characteristic of the voltage divider voltage E2) becomes flat (a constant value A1) in the frequency domain equal to or higher than the cutoff frequency f1 and shows a monotonous increase with respect to an increase of the frequency in the frequency domain equal to or lower than the cutoff frequency f1.

Figure 3B:
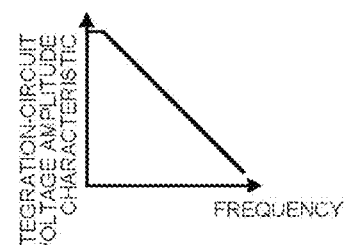

The integration circuit 20 has a voltage amplitude characteristic as shown in FIG. 3B. In FIG. 3B, frequency is plotted on the horizontal axis and the integration-circuit voltage amplitude characteristic is plotted on the vertical axis. The horizontal axis and the vertical axis are both displayed on a logarithmic scale. As shown in FIG. 3B, the integration-circuit voltage amplitude characteristic shows a monotonous decrease with respect to an increase of the frequency, except the low frequency side on which a flat frequency domain (having a constant value) is present reflecting that the integration circuit 20 is an incomplete integration circuit.

Figure 3C:
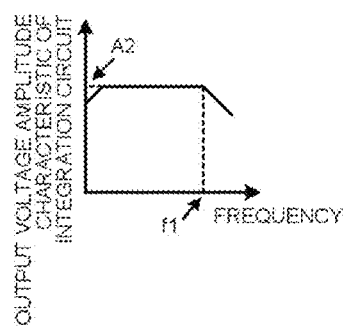

In FIG. 3C, frequency is plotted on the horizontal axis and the output voltage amplitude characteristic of the integration circuit 20 is plotted on the vertical axis. The horizontal axis and the vertical axis are both displayed on a logarithmic scale. When the voltage divider voltage E2, which is the output of the voltage divider 30, is integrated by the integration circuit 20 having the integration-circuit voltage amplitude characteristic shown in FIG. 3B, the output voltage characteristic of the integration circuit 20 becomes as shown in FIG. 3C. That is, as a result of multiplication of the frequency characteristic of the output voltage amplitude of the voltage divider 30 (FIG. 3A) by the frequency characteristic of the voltage amplitude of the integration circuit 20 (FIG. 3B), the output voltage amplitude characteristic of the integration circuit 20 (FIG. 3C) becomes flat (a constant value A2) in the frequency domain equal to or lower than the cutoff frequency f1, excluding a part on the low frequency side due to the integration circuit 20 being an incomplete integration type. However, the output voltage amplitude characteristic of the integration circuit 20 (FIG. 3C) shows a monotonous decrease with respect to an increase of the frequency in the frequency domain equal to or higher than the cutoff frequency f1.

The integration circuit 20 can be configured, for example, as shown in FIG. 2. That is, the integration circuit 20 is configured to include an operational amplifier 41, an input resistor 42 (a resistance value R2) connected to the negative-side input terminal of the operational amplifier 41, a feedback capacitor 43 (a capacitance C4) connected between the negative-side input terminal and the output terminal of the operational amplifier 41, and a resistor 44 connected in parallel with the feedback capacitor 43. In this example, the input resistor 42 is connected to the intermediate electrode 2 and the positive-side input terminal of the operational amplifier 41 is connected to the tank 3. When the resistor 44 is not provided or a resistance value thereof is significantly large, the integration process becomes a complete integration type or a substantially complete integration type. However, generally, there is a non-zero resistance value in an analog circuit.

Figure 3D:
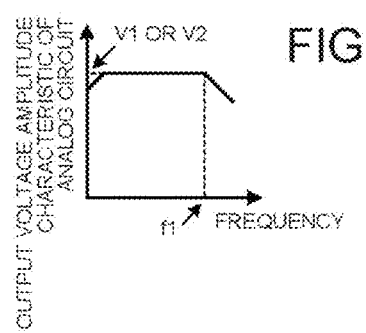

The analog circuit 5 (first gain adjusting unit) amplifies the output voltage of the integration circuit 20 to a specified amplitude. That is, the output voltage amplitude characteristic of the analog circuit 5 is similar to that shown in FIG. 3C. However, the flat output voltage in the frequency domain is amplified to a specified amplitude value as compared to that of the integration circuit 20. The specified amplitude in this example is determined in the following manner. The size of the amplitude of the input voltage of the A/D converter 6 is set in advance according to its application (for protection, measurement, or the like) of the voltage detection device 50. For example, if the voltage detection device 50 has two application purposes, the size of the amplitude of the input voltage of the A/D converter 6 is determined to be, for example, V1 or V2. In the present embodiment, because the output voltage of the integration circuit 20 is generally lower than V1 and V2, the gain of the analog circuit 5 is adjusted in advance such that the output voltage of the analog circuit 5 becomes V1 or V2 as shown in FIG. 3D.

Figure 3E:
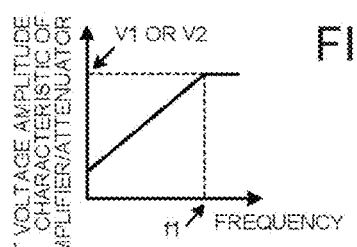

The amplifier/attenuator 21 (second gain adjusting unit) has both a function as an amplifier and a function as an attenuator, and can switch between these functions and use any of these functions. The voltage divider voltage E2 is input to the amplifier/attenuator 21. As described above, the amplitude characteristic of the voltage divider voltage E2 is represented as shown in FIG. 3A. As shown in FIG. 3E, the amplifier/attenuator 21 amplifies or attenuates the voltage divider voltage E2 to a specified amplitude. Accordingly, although the output voltage amplitude characteristic of the amplifier/attenuator 21 is the same as that shown in FIG. 3A, the gain of the amplifier/attenuator 21 is adjusted such that the output voltage in the frequency domain equal to or higher than the cutoff frequency f1 (a region in which the voltage amplitude characteristic is flat) has the same amplitude value as the output voltage of the analog circuit 5 in the frequency domain equal to or lower than the cutoff frequency f1 as shown in FIG. 3D (a region in which the voltage amplitude characteristic is flat). For example, in a case where the size of the amplitude of the input voltage of the A/D converter 6 is V1 or V2 and V1<E2<V2 is satisfied as described above, when the size of the amplitude of the input voltage of the A/D converter 6 is set to V1, the gain of the amplifier/attenuator 21 is adjusted such that the amplifier/attenuator 21 functions as an attenuator, and when the size of the amplitude of the input voltage of the A/D converter 6 is set to V2, the gain of the amplifier/attenuator 21 is adjusted such that the amplifier/attenuator 21 functions as an amplifier. The amplifier/attenuator 21 can be configured by combining a conventional amplifier and a conventional attenuator.

The adder 22 is an analog circuit that adds the output voltage of the analog circuit 5 and the output voltage of the amplifier/attenuator 21 to output the sum of the output voltages to the A/D converter 6. The A/D converter 6 converts analog data, which is the output of the adder 22, to digital data and sends the digital data to the microcomputer 7.

The operations of the present embodiment are explained next. The central conductor voltage (a voltage to ground) E1, which is the voltage of the central conductor 1, is divided so as to be the voltage divider voltage E2 having a high-pass characteristic due to the high-pass filter constituting the voltage divider 30 (FIG. 3A), and then the voltage divider voltage E2 is input to each of the integration circuit 20 and the amplifier/attenuator 21.

The voltage divider voltage E2 input to the integration circuit 20 is integrated by the integration circuit 20 (FIG. 3C) and is output to the adder 22 after the output voltage equal to or lower than the cutoff frequency f1 is amplified to a specified amplitude value by the analog circuit 5 (FIG. 3D).

Meanwhile, the voltage divider voltage E2 input to the amplifier/attenuator 21 is gain-adjusted such that the voltage equal to or higher than the cutoff frequency f1 has the same value as the specified amplitude value of the output voltage of the analog circuit 5, and is then output to the adder 22 (FIG. 3E).

Figure 3F:
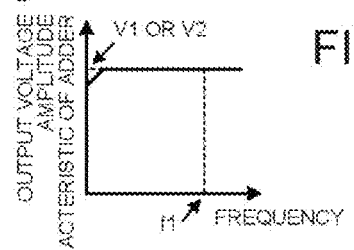

The adder 22 adds the output voltage of the analog circuit 5 and the output voltage of the amplifier/attenuator 21. At this time, the output voltage amplitude characteristic of the analog circuit 5 (FIG. 3D) and the output voltage amplitude characteristic of the amplifier/attenuator 21 (FIG. 3E) are added; therefore, the output voltage amplitude characteristic of the analog circuit 5 substantially appears when the frequency is equal to or lower than the cutoff frequency f1, and the output voltage amplitude characteristic of the amplifier/attenuator 21 substantially appears when the frequency is equal to or higher than the cutoff frequency f1. Accordingly, for the entire frequency domain, as shown in FIG. 3F, it is possible to obtain an output voltage amplitude characteristic that is substantially flat over the entire frequency domain excluding a part on the low frequency side due to the integration circuit 20 being an incomplete integration type. In FIG. 3F, frequency is plotted on the horizontal axis and the output voltage amplitude characteristic of the adder 22 is plotted on the vertical axis. The horizontal axis and the vertical axis are both displayed on a logarithmic scale.

The output of the adder 22 is input to the A/D converter 6, is converted from analog data to digital data by the A/D converter 6, and is output to the microcomputer 7. Furthermore, the microcomputer 7 transmits the digital data to the higher-level device 10. In this manner, the voltage signal waveform of the central conductor 1 can be reproduced with high fidelity over a wide band.

The integration circuit 20 is arranged before the analog circuit 5; therefore, the analog circuit 5 does not saturate due to a high-pass characteristic of the voltage divider.

Figure 4:
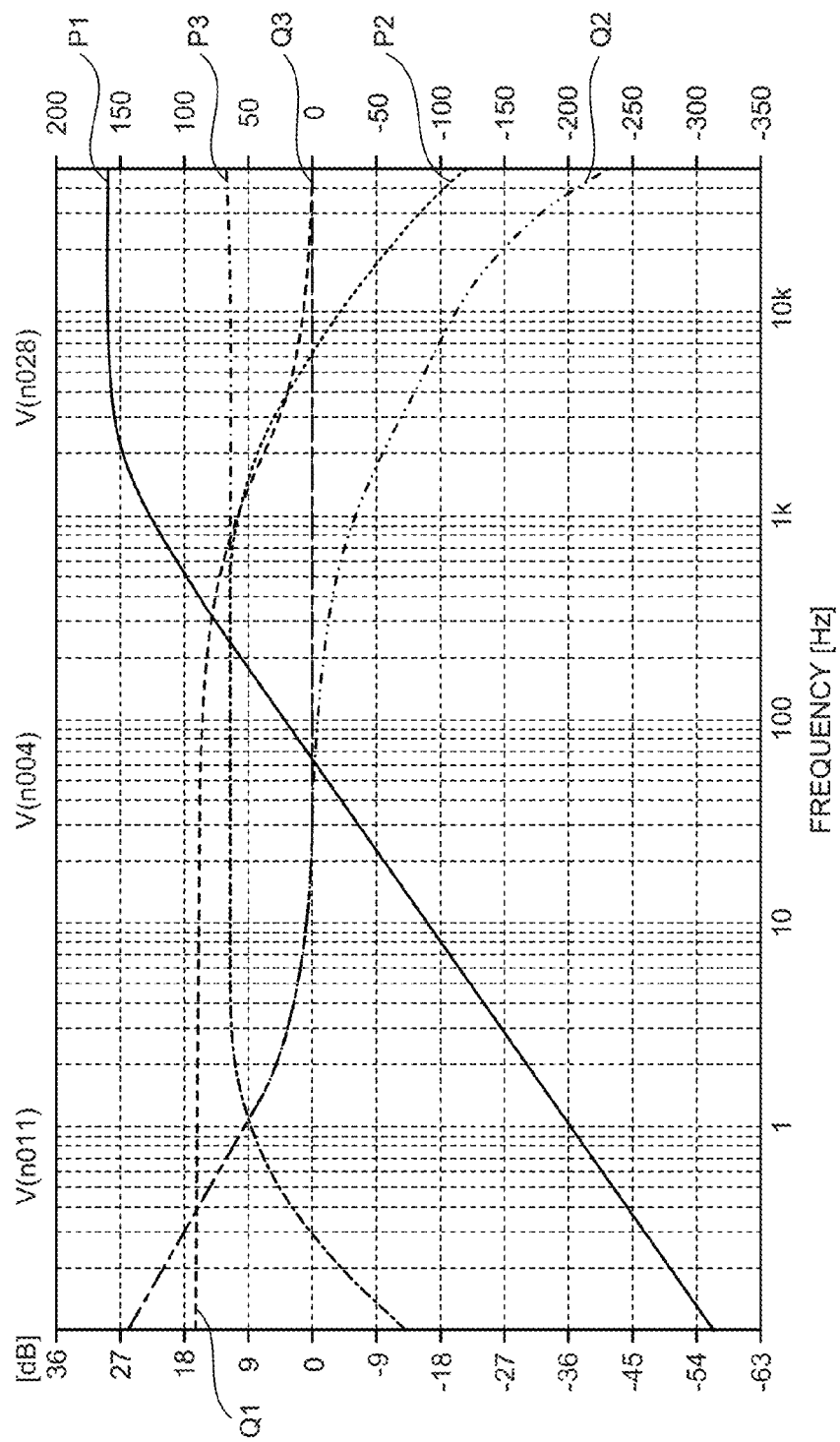
FIG. 4 is a graph showing examples of voltage-divider output voltages (P1 and Q1), analog-circuit output voltages (P2 and Q2), and adder output voltages (P3 and Q3) according to the embodiment.

FIG. 4 is a graph showing examples of voltage-divider output voltages (P1 and Q1), analog-circuit output voltages (P2 and Q2), and adder output voltages (P3 and Q3) according to the present embodiment. More specifically, P1 indicates an amplitude characteristic of the output voltage of the voltage divider, Q1 indicates a phase characteristic of the output voltage of the voltage divider, P2 indicates an amplitude characteristic of the output voltage of the analog circuit 5, Q2 indicates a phase characteristic of the output voltage of the analog circuit 5, P3 indicates an amplitude characteristic of the output voltage of the adder 22, and Q3 indicates a phase characteristic of the output voltage of the adder 22. As can be understood from P3 and Q3, the adder output voltage becomes substantially flat over a wide band.

As described above, according to the present embodiment, the integration circuit 20 is provided at the most upstream stage of the signal processing circuit 4, and the signal obtained by integrating the output of the voltage divider by the integration circuit 20 and amplifying the integrated output by the analog circuit 5 and the signal obtained by gain-adjusting the output of the voltage divider by the amplifier/attenuator 21 are added by the adder 22, thereby enabling the frequency characteristic to be made substantially flat at the final output stage of the signal processing circuit 4 over a wide band.

Therefore, according to the present embodiment, even high-frequency components generated transitionally when an accident or the like occurs can be accurately detected over a wide band.

INDUSTRIAL APPLICABILITY

As described above, the present invention is useful as a voltage detection device for a transformer.

REFERENCE SIGNS LIST

1 central conductor, 2 intermediate electrode, tank, 4 signal processing circuit, 5 analog circuit, 6 A/D converter, 7 microcomputer, 10 higher-level device, stray capacitance, 12 earth capacitance, 13 external voltage-dividing resistor, 20 integration circuit, 21 amplifier/attenuator, 22 adder, 30 voltage divider, 41 operational amplifier, 42 input resistor, 43 feedback capacitor, 44 resistor, 50, 100 voltage detection device.

The invention claimed is:

1. A voltage detection device in which an intermediate electrode is provided between a central conductor to which a voltage is applied and a grounded tank to constitute a voltage divider, and that detects a voltage of the central conductor on a basis of a voltage of the voltage divider, the device comprising:
    an integration circuit to which a voltage of the voltage divider is input, the voltage divider having a high-pass filter characteristic formed by a stray capacitance between the central conductor and the intermediate electrode, an earth capacitance between the central conductor and the tank, and a voltage dividing resistor connected in parallel with the earth capacitance;
    a first gain adjusting unit that amplifies an output voltage of the integration circuit to a specified amplitude;
    a second gain adjusting unit to which a voltage of the voltage divider is input and that amplifies or attenuates the voltage of the voltage divider to the specified amplitude; and
    an adder that adds an output voltage of the first gain adjusting unit and an output voltage of the second gain adjusting unit.

2. The voltage detection device according to claim 1, wherein
    each of the integration circuit, the first gain adjusting unit, the second gain adjusting unit, and the adder is configured from an analog circuit, and
    the voltage detection device further comprises an A/D converter to which an output voltage of the adder is input.

* * * * *